United States Patent [19]

Schramm et al.

[11] Patent Number: 4,894,095

[45] Date of Patent: Jan. 16, 1990

[54] METHOD FOR WASHING AND RINSING OF USED LITHOGRAPHIC PLATE MEMBERS

[75] Inventors: Gary L. Schramm, Brookfield; Ralph G. Pontillo, New Berlin; Richard J. Hladilek, West Allis, both of Wis.

[73] Assignee: Law Offices of Dick and Harris, Chicago, Ill.

[21] Appl. No.: 141,483

[22] Filed: Jan. 5, 1988

Related U.S. Application Data

[62] Division of Ser. No. 738,468, May 28, 1985, Pat. No. 4,733,422.

[51] Int. Cl.$^4$ ............................ B08B 3/08; B08B 3/10
[52] U.S. Cl. .................................... 134/2; 134/25.1; 134/25.4; 134/26; 134/27; 134/38; 134/39; 134/40; 134/41
[58] Field of Search ............... 134/26, 22.19, 2, 25.4, 134/25.6, 27, 38, 39, 40, 41

[56] References Cited

U.S. PATENT DOCUMENTS

| | | | |
|---|---|---|---|
| 580,312 | 4/1897 | Harris | 15/77 |
| 1,072,902 | 9/1913 | Benedict | 15/77 |
| 1,633,216 | 6/1927 | Lakeman | 15/77 |
| 2,726,414 | 12/1955 | Lindquist | 15/4 |
| 2,926,371 | 3/1960 | Swindler | 15/77 |
| 3,382,520 | 5/1968 | Savart | 15/77 |
| 3,479,852 | 11/1969 | Conrad et al. | 72/40 |
| 3,682,079 | 8/1972 | Casson, Jr. | 95/89 R |
| 4,034,433 | 7/1977 | Slingsby | 15/77 |
| 4,383,751 | 5/1983 | Schornig et al. | 354/322 |
| 4,464,035 | 8/1984 | Schoering | 354/299 |

Primary Examiner—Asok Pal
Attorney, Agent, or Firm—Law Offices of Dick and Harris

[57] ABSTRACT

An apparatus and method for facilitated automatic washing and rinsing of previously used lithographic plate members having substantially flat central portions and pre-formed parallel flanged peripheral edges which comprises removing one or more used plates from a press plate drum, placing the plate on a feed fixture, longitudinally propelling the plate member, applying one or more cleaning solvents to the surface of the plates, scrubbing the surfaces of the plates, rinsing the surfaces thereof with one or more solvents, removing of excess rinse liquids from the surfaces of the plates, sealing the surfaces with a water soluble preserving substance and storing of the plate members until reuse thereof, while accommodating and preserving the peripheral pre-formed flanges of the lithographic plates as they pass through the apparatus, and recycling the cleaning solvent.

26 Claims, 1 Drawing Sheet

METHOD FOR WASHING AND RINSING OF USED LITHOGRAPHIC PLATE MEMBERS

This application is a divisional application of pending prior application Ser. No. 06/738,468 filed on May 28, 1985 now U.S. Pat. No. 733,422.

BACKGROUND OF THE INVENTION

The present invention relates in general to the devices and methods for cleaning and archiving of used lithographic plates having pre-formed peripheral edge flanges and in particular to a lithographic plate washing method and apparatus for the facilitated automatic washing and rinsing of previously used lithographic plate members having substantially flat central portions and pre-formed parallel flanged peripheral edges.

Modern web and sheet-feed lithographic printing is done through the use of metal plates having pre-formed flanges formed in their peripheral edges so as to enable them to be wrapped around and held by the cylinder of a printing press and thereby used for printing by rotary methods. As a rule, the images upon the plates are not printed directly from the plate on to the paper, but are first transferred to an intermediate rubber cylinder which then transfers or "offsets" the image to the paper. Since grease and water are normally mutually repellent, ink is applied to ink receptive oleophyllic treated printing areas of a lithographic plate, while the non-printing parts, which absorb and hold water (i.e. the hydrophyllic areas), reject the greasy ink.

Once these lithographic plates are used, the conventional method through which they are "reprocessed" or cleaned for reuse involves a removal from the archiving area, and the preliminary removal of gum arabic sealant which has been previously placed on the plate to prevent moisture damage due to oxidation during storage since the images to be printed are normally photographically exposed to a light sensitive coating on the material. The gum arabic sealant is normally applied right over the ink residue and contaminants, thereby requiring the normally laborious hand operation of "hand scrubbing" the unsealed plate over a down draft sink with DUMAKLEEN brand solvent or the like and sponges.

The prior art has included apparata such as the Kodak polymatic plate processor (Model No. 48A) which, among other things, apply rotary scrubbing operations to lithographic plates. Devices such as Harris U.S. Pat. No. 580,312, Bendedict, U.S. Pat. No. 1,072,902 and Lakeman, U.S. Pat. No. 1,633,216 have employed one or more brushes to clean plates, as well. Lakeman '216 further employs a perforated solvent sprayer rod. Lindquist, Pat. No. 2,726,414 includes brushes, rollers and other apparata for washing, cleaning and drying lithographic plates.

Swindler, U.S. Pat. No. 2,926,371 employs a brush treatment system with interrupted rollers for treating the edges of bent sheets of laminated safety glass. Conrad et al., U.S. Pat. No. 3,479,852 provides for the treatment of strip metal with special edge forming elements. Savort, U.S. Pat. No. 3,382,520 includes separate rinse tanks for the treatment of offset printing plates. Casson, Jr., U.S. Pat. No. 3,682,079 is another plate developing apparatus employing feed rollers for conveying, and which applies developing solution, applies a rinse to the plate, and has developer and rinse tanks. Casson '079 also applies gumming solution to the plates.

Drawbacks have been encountered with lithographic plate processors such as the above-described prior art. In particular, such conventional devices present problems in maintaining the pre-formed peripheral edge flanges in the plate members during the processing thereof. Moreover, the present aforementioned method of "hand scrubbing" the plate members prior to reuse thereof, is unacceptably laborious and time consuming.

Hence, the present invention has as an object the facilitating of more effectively cleaning such used lithographic plate members.

Moreover, the present invention has as an object the providing of substantially automatic and continuous feeding into the apparatus, dispensing of cleaning solvent onto the plate, scrubbing, rinsing and removal from the apparatus while accommodating and preserving the peripheral pre-formed flanges formed of the plate members.

The present invention has the further object of providing an economical way of recycling the relatively costly cleaning solvent for reapplication and reuse in the apparatus.

The present invention has the further object of increasing the cost-effectiveness of archiving used lithographic plate members for future reuse.

These and other objects of the invention will become apparent in light of the present specification, drawings and claims.

SUMMARY OF THE INVENTION

The present invention comprises a lithographic plate washing apparatus for the facilitated automatic washing and rinsing of previously used lithographic plate members which have substantially flat central portions and pre-formed parallel flanged peripheral edges. The apparatus comprises feed fixture means which are capable of accommodating at-least one of the flanged lithographic plate members thereon. In addition, one or more drive means are positioned adjacent and operably aligned with the feed fixture means so as to receive and longitudinally propel at least one lithographic plate member through the apparatus. The drive means have flange accommodation means to accommodate and preserve the shape of the peripheral flanges formed in the lithographic plates. Scrubbing station means are operably positioned between the drive means so as to receive the lithographic plate members from the drive means and dispense cleaning solvent through solvent dispensing means and apply scrubbing action by scrubbing means contacting the plate member.

The scrubbing station means further have an entry side and an exit side, and are operably associated with the drive means so as to enable the drive means to engage and longitudinally propel the lithographic plate member from the entry side of the scrubbing station means to the exit side of the scrubbing station means. The scrubbing station means further include rinse means for the application of one or more liquid rinses to the plate members passing therethrough. Also, the scrubbing station means further include rinse fluid drainage means operably associated with the rinse means and the drive means for collection of the rinse fluid from the scrubbing station. Removal fixture means are also operably aligned with and juxtaposed to the scrubbing station means so as to receive the lithographic plate members from the drive means. The removal fixture means further include lithographic plate member flange accommodation means associated there-with to further accommodate and preserve the shape of the peripheral flanges formed therewithin.

Frame means operably support the feed fixture means, the drive means, the scrubbing station means and the removal fixture means. Control means are also operably associated with the drive means and the scrubbing station means for coordinating the feeding, driving, dispensing of cleaning solvent, scrubbing, rinsing and removing of the plate members into, through and from the apparatus.

The flange accommodation means of the drive means are also operably aligned and associated with the feed fixture flange accommodation means and the removal fixture flange accommodation means so as to enable accommodation and preservation of the shapes of the peripheral flanges formed in lithographic plate members as the plate members pass through said feed fixture means, the scrubbing station means and the removal fixture means. Hence, the control means, feed fixture means, drive means, scrubbing station means and removal fixture means cooperate so as to provide substantially automatic and continuous feeding, dispensing of cleaning solvent, scrubbing, rinsing and removing of the lithographic plate members into, through and from the apparatus, while accommodating and preserving the peripheral flanges formed therein.

The invention further comprises support means interposed between the drive means so as to support the plate members as the plate members are longitudinally propelled through the apparatus. The support means further include flange accommodation means to accommodate and preserve the shape of the peripheral flanges formed in the lithographic plates. The flange accommodation means of the support means are operably aligned and associated with the feed fixture flange accommodation means, the drive means, flange accommodation means and the removal fixture flange accommodation means so as to enable accommodation and preservation of the shapes of the peripheral flanges formed in the plate members as the plate members pass through the apparatus.

The frame means operably support the feed fixture means, the drive means, the support means, the scrubbing station means and the removal fixture means. The frame means further support the drive means so as to form one or more nip regions thereat. Frame means operably support the support means so as to form one or more substantially planar support surfaces therein. Frame means further support the scrubbing station means so as to form a brush contact region therebelow. Also, the aforementioned one or more nip regions, the planar support surfaces and the brush contact region are all positioned in a substantially horizontal planar arrangement.

The invention further comprises the feed fixture means, the support means and the removal fixture means further including substantially flat planar sliding surfaces The flange accommodation means in the feed fixture means, support means and removal fixture means comprise a plurality of slots formed in the substantially flat planar sliding surfaces The feed fixture means, the support means and the removal fixture means are capable of accommodating a plurality of plate member sizes through the positioning and location of the plurality of slots. The plurality of plate member sizes capable of being accommodated by the feed fixture means, the support means and the removal fixture means is four.

In addition, one or more of the feed fixture means, support means and removal fixture means of the present invention can include one or more nylon glides positioned thereon. Moreover, the drive means flange accommodation means can comprise one or more interruptions in the drive means. The drive means can comprise one or more pairs of substantially parallel upper and lower rotating rollers which are positioned substantially perpendicular to the longitudinal direction of the plate members. Further, the drive rollers can be made of a substantially elastomeric material. At least the lower drive roller is driven by motor means, however both rollers of each pair of drive rollers can be rotatably powered.

The scrubbing station means can further include one or more collection sinks positioned proximately below the scrubbing station means, tank means including a filter for collecting used solvent and a pump for recirculation of cleaning solvent. The scrubbing station further includes one or more electrically powered rotary brushes having their longitudinal axes positioned substantially perpendicular to the longitudinal direction of propelling the plate members through the apparatus. The scrubbing station means can further include one or more solvent sprayers positioned therein for dispensing of cleaning solvent to the plate members passing through the apparatus. The scrubbing station means can further include exhaust means positioned proximately atop the collection sink so as to draw away cleaning solvent fumes.

The rinse means further includes one or more rinse scrubbers for application of scrubbing action to the plate members passing through the apparatus. Moreover, the rinse means includes collection and drain means which can comprise a sink positioned proximately below the remainder of the rinse means. Moreover, the rinse means further include at least one pair of squeegee rollers for the removal of excess liquid rinses. In addition, the rinse means further include a rinse sprayer means operably contained therein and having a plurality of discharge streams for the release of liquid rinses. In the preferred embodiment the drive means comprises four pairs of drive roller members with a first pair of drive roller members being juxtaposed to the feed fixture means proximate the entry side of the scrubbing station means. A second pair of drive roller members is positioned proximate the solvent dispensing means. A third pair of drive roller members is positioned proximate the rinse means and a fourth pair of drive roller members is juxtaposed to the removal fixture means proximate the rinse scrubbers and the exit side of the scrubbing station means.

The present invention provides a method for cleaning, storing and unsealing one or more lithographic plate members having pre-formed peripheral flanges and ink residue and other contaminants on its surface, comprising the steps of first removing one or more used plates from a press drum. The plate members are then placed on feed fixture means and longitudinally propelled by drive means. One or more cleaning solvents are then applied to the surface .of the plate members prior to scrubbing of the surfaces of the plate members. The plate members are then rinsed with one or more solvents and scrubbed again prior to removing of excess rinse liquid from the surfaces of the plate members. Sealing of the surfaces of the plate members with a water soluable preserving substance is then done so as to reduce the moisture damage due to oxidation of the lithographic plate. The water soluable nature of the preserving substance enables removal of it during a subsequent press run from the press's own water train. The final step in the method is storing of the now cleaned plate member until reuse thereof.

DETAILED DESCRIPTION OF THE DRAWINGS

While this invention is susceptible of embodiment in many different forms, there is shown in the drawings and will herein be described in detail, one specific embodiment, with the understanding that the present disclosure is to be considered as an exemplification of the principles of the invention and is not intended to limit the invention to the embodiment illustrated.

A preferred embodiment of the invention is shown in FIGS. 2 through 6. FIG. 1 shows a lithographic plate member 11 having a substantially flat central portion 14 and preformed parallel flanged peripheral edges 12 and 13. Since plate member 11 is used in a planographic printing process, the matter to be printed appearing on central portion 14 of plate member 11 is not raised above the surface of the plate as in letter press or "relief" printing nor sunk below the surface (as in intaglio printing) but remains substantially flush with the surface.

Figures 1, 3, 4, 5, 6:
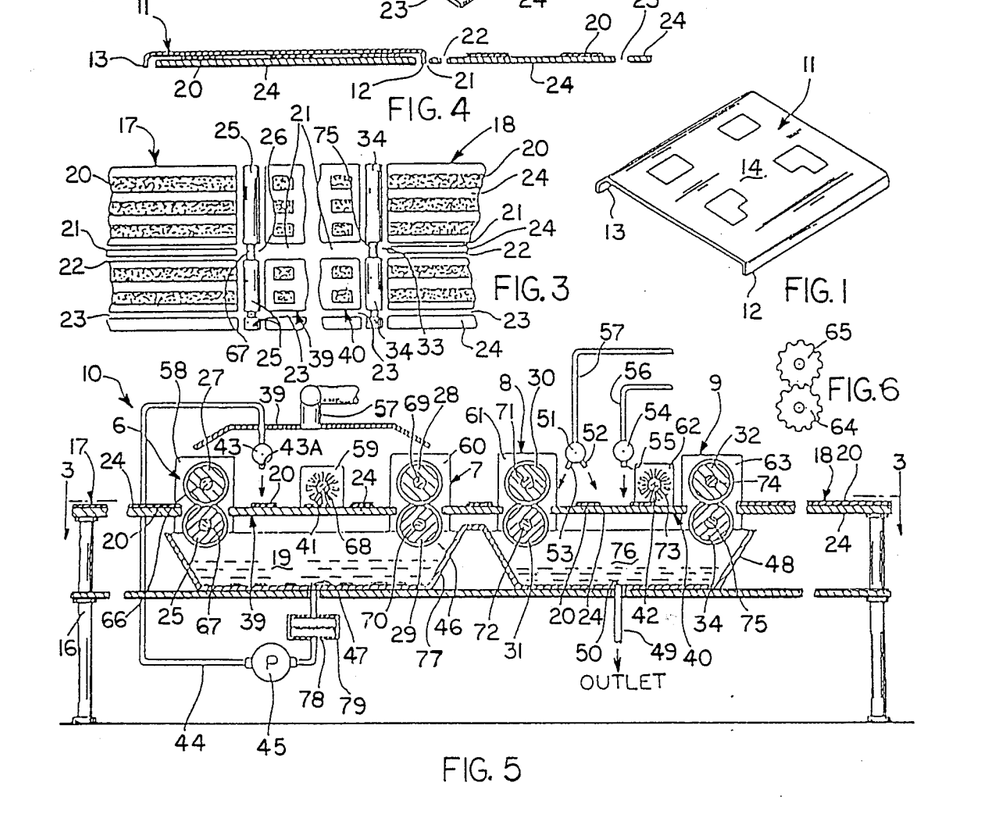
FIG. 1 is a prospective view of a lithographic plate member showing its preformed peripheral flange edge.
FIG. 3 is a partial top cross-sectional view of the apparatus taken through lines 3—3 of FIG. 5 and looking in the direction of the arrows showing particularly the feed fixture means, roller members, support means and removal fixture means.
FIG. 4 is a side cross-sectional taken along line 4—4 of FIG. 2 and looking in the direction of the arrows showing a lithographic plate member positioned atop the feed fixture means.
FIG. 5 is a partial side cross-sectional view of the apparatus showing in particular the feed fixture means, support means, drive means, scrubbing station means, exhaust means and removal fixture means.
FIG. 6 is a schematic drawing of the gear means employed within the drive means.

In the aforementioned lithographic printing process, ink is applied to certain pre-determined oleophyllic printing areas of plates 11, while the designated hydrophyllic nonprinting parts of lithographic plate 11, (which absorb and hold water,) reject the greasy ink. Lithographic plate members 11 in the preferred embodiment are made of metal, such as zinc, aluminum, chrome and copper and stainless steel and thus have the advantage that they can be wrapped around the cylinder of a printing press and can thus be used for printing by rotary methods. Lithographic plate members 11 printing surfaces 14, when used for offset lithography, are commonly produced by photographic processes, with the metal plate 11 being given a sensitized coating which is then photographically exposed and developed into the desired image to be printed. Flanges 12 and 13 which are preformed along the peripheral edges of plate member 11 enable attachment to a printing press drum for the aforementioned process.

Figure 2:
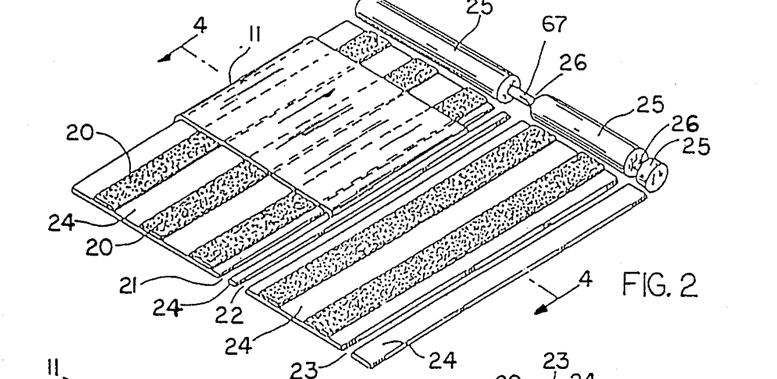
FIG. 2 is a prospective view of a lithographic plate member positioned atop the feed fixture means prior to contacting the first rollers.

FIG. 2 shows the feed fixture means 17 receiving lithographic plate member 11 thereon. Specifically, feed fixture means 17 includes substantially flat planar sliding table surface 24 and slots or interruptions 21, 22 and 23 formed therein which enable feed fixture means 17 to accommodate, in the preferred embodiment, four different size lithographic plate members 11 by having obtuse flange 13 of plate member 11 abut the left edge of feed fixture means 17, (when viewed as in FIG. 4) while having the other substantially perpendicular peripheral edge flange 12 of plate member 11 be received within either slots 21, 22, or 23, or overhang the opposite edge of table surface 24. The locations of slots 21, 22 and 23 correspond to the widths of the most commonly used lithographic plate sizes. Other embodiments for the present invention could provide for the simultaneous accommodation of more than one plate member 11 or any number of other sizes of plates. In the preferred embodiment the slots 21, 22 and 23 serve as feed fixture flange accommodation means in the aforementioned manner shown in FIG. 2, thereby accommodating and preserving the flanges 12 and 13 formed in plate members 11 longitudinally passing through apparatus 10.

Feed fixture means 17 further includes glides 20, consisting in the preferred embodiment of strips of substantially elastomeric or nylon-like material positioned and affixed along the top of sliding table surface 24 so as to prevent marring of plate member 11 as well as to prevent binding of the plate member 11 moved laterally along the feed fixture means 17, as a result of surface adhesion or the like caused by moisture therebetween. Further shown in FIG. 2, as an example of the construction of drive means lower roller members 25, 29, 31 and 34 is roller member 25 of the drive means assembly 6, positioned adjacent to feed fixture means 17 and consisting in the preferred embodiment of three outer roller portions 25 surrounding and journaled or otherwise securely affixed to central shaft 67 and having interruptions 26 therein substantially aligned with slots 21, 22, and 23 formed in feed fixture means 17 so as to accommodate and preserve the shapes of peripheral flanges 13 and 14 formed in lithographic plate member 11 as the plate member 11 passes through the feed fixture means 17 and particularly over lower roller members such as roller 25. All eight roller members of the drive means of the preferred embodiment are assembled so that outer cylinders 27, 25, 28, 29, 30, 31, 32 and 34 in the preferred embodiment being formed of a substantially elastomeric material, such as rubber, are securely affixed to central shafts 66, 67, 69, 70, 71, 72, 74 and 75 passing therethrough so as to result in rotation of such outer cylinders and the shafts of each roller member as single units.

In the preferred embodiment, interruptions, such as 67, in the lower roller members 25, 29, 31 and 34 aligned with slots 21 and 22, serve as means enabling accommodation and preservation of the shape of the peripheral flanges 12 and 13 formed in the lithographic plate members 11 as plate members 11 pass through the drive means apparatus 10. Moreover, lower roller members 25, 29, 31 and 34 extend from the top edges of feed fixture means 17, support means 39 and 40 and removal fixture means 18 to the top edges of slots 23, (as viewed in FIG. 3,) so as to enable even the peripheral edge flanges 12 and 13 of larger sizes of plate member 11 to pass through the apparatus 10, while preserving the shape thereof.

FIG. 3 shows a top view of feed fixture means 17 and slots 21, 22, and 23 formed therein which serve to accommodate and preserve the flanges 12 and 13 of plate members 11 passing across the feed fixture means 17 of the preferred embodiment. Also shown in FIG. 3 are glides 20 securely affixed to the top surfaces 24 of the feed fixture means 17, support means 39 and 40, and removal fixture means 18. As shown in FIGS. 3 and 5, feed fixture means 17, support means 39 and 40 and removal fixture means 18 include substantially flat planar sliding surfaces 24 for supporting and carrying the plate members 11 as they are longitudinally propelled through the apparatus 10 by the drive means 6, 7, 8 and 9. As further shown in FIG. 3 support means 39 and 40 include slots 21 and 23 substantially aligned with slots 21, 22 and 23 formed in feed fixture means 17 and removal fixture means 18. Alternative embodiments with different combinations of aligned slots in feed fixture means 17, support means 39 and 40 and removal fixture means 18 to accommodate different sizes of plate members 11, should be considered as being within the scope of the present invention.

Also shown in FIG. 3 are interruptions 26 and 33 in roller members 25 and 34, respectively, likewise aligned with slots 21 and 22 of feed fixture means 17, support means 39 and 40, and removal fixture means 18. Slots 21, 22 and 23 and interruptions 26 and 33 are positioned in their respective sliding surfaces 24 and roller members 25, 29, 31 and 34, so as to accommodate several of the most common size of lithographic plate members 11. In the preferred embodiment, the top and bottom edges, when viewed as in FIG. 3, of feed fixture means 17, support means 39 and 40 removal fixture means 18 are in substantial alignment.

FIG. 4 shows feed fixture means 17 with plate member 11 thereon in cross section. Specifically, feed fixture means 17 includes substantially flat planar sliding table 24 having glides 20 affixed to its top surface. Further shown are slots 21, 22 and 23 formed within sliding table 24. As shown in FIG. 4, flange 13 of plate member 11 overhangs the left edge of planar surface 24 while the remaining peripheral flange 12 of plate member 11 is received in slot 21, in the example shown. However, larger plates 11 could be likewise accommodated by feed fixture means 17 by having their peripheral flanges 12 received in a similar fashion by slots 22 or 23. In the case of a still larger plate member 11, peripheral flange 13 would overhang the left edge of planar sliding surface 24 while flange 12 would overhang the right edge of planar surface 24, when viewed as in FIG. 4. Glides 20 are shown in FIG. 4 as being interposed between plate member 11 and planar surface 24 so as to prevent any binding or marring of the plate member 11. Both support means 39 and 40 and removal fixture means 18 are similarly constructed and possess similarly aligned and positioned slots 21, 22 and 23, glides 20 and planar table surface 24.

Frame means 16 is shown in FIG. 5 supporting feed fixture means 17, scrubbing station means 46, support means 39 and 40, drive means assemblies 6, 7,.8, and 9 including roller members 25, 27, 28, 29, 30, 31, 32 and 34, and removal fixture means 18. As shown in FIG. 5, the preferred embodiment of apparatus 10 includes drive means assemblies 6, 7, 8 and 9 comprising several sets of cooperating pairs of roller members such as 25 and 27, 28 and 29, 30 and 31, and 32 and 34 which are arranged in substantially parallel arrangements and positioned with their axes of rotation substantially perpendicular to the longitudinal direction of plate members 11 so as to provide a nip region between each set of rollers to receive, engage, support and longitudinally propel plate members 11 through the apparatus by rotation in opposite relative directions of each of the pairs of roller members.

Interposed between the feed fixture means 17 and the first pair of rollers 27 and 25 is support means 39 including planar surface 24 and glides 20 affixed to its top surface. Support means 39 is interrupted for an interval so as to accommodate first drive means assembly 6 comprising roller members 27 and 25. Support means 39 is also interrupted for an interval to accommodate second drive means assembly 7 including roller members 28 and 29 in a similar arrangement. Likewise, support means 40 is interrupted once to accommodate the third drive means assembly 8 comprising upper roller member 30 and lower roller member 31 and again to accommodate fourth drive means assembly 9 comprising upper roller member 32 and lower roller member 34 arranged in similar fashion.

Scrubbing station means 46 is operably positioned between the first and fourth drive means assemblies 6 and 9 respectively and dispenses cleaning solvent 19 through cleaning solvent dispensing means 43 and in particular nozzle 43A, after receiving plate members 11 from drive means assembly 6 into the entry side of scrubbing station means 46. Scrubbing action is further provided by scrubbing means 41 including rotary scrubber brush 41 fixedly mounted onto central shaft 68 and contacting plate member 11. Frame 16 supports scrubbing means 41 and 42 so as to form a brush contact region thereunder for plate members 11 to pass through. The nip regions of drive means assemblies 6, 7, 8, and 9, planar surfaces 24 and brush contact regions of scrubbing means 41 and 42 are all positioned by frame means 16 so as to be in a substantially horizontal planar arrangement. Rotary scrubber brush 41 is positioned with its longitudinal axes positioned substantially perpendicular to the longitudinal direction of propelling plate members 11 through apparatus 10. Ventilation hood 39 is positioned proximately above the cleaning solvent dispensing means 43 and communicates with extractor fan means 57 so as to enable the removal of any solvent fumes that may arise and otherwise accumulate. Underneath the first and second drive means assemblies 6 and 7 and the solvent dispensing means 43, is first solvent sink 77 having drain 47 leading to tank 78 and filter 79 and to recirculating pump 45 leading in turn, into return conduit 44 and finally to solvent dispensing means 43 and nozzle 43A. Spent solvent 19 is shown collected in first sink 77 before passing into tank 78 having filter 79 therein to filter out impurities therein, prior to recirculation thereof by pump 45 for reapplication by solvent dispensing means 43.

To the right of third drive means assembly 8, when viewed as in FIG. 5, are rinse means 51 and 54 for the application of one or more liquid rinses to the plate members 11 passing thereunder. In the preferred embodiment the liquid rinse 76 is water and rinse means 51 include liquid rinse conduit 57 and sprayer 52 having twin rows of several liquid rinse discharge jets or streams formed along its length serving as discharge streams. Rinse means 54 includes rinse liquid conduit 56 and sprayer 55 consisting of a cylindrical rod having a single row of liquid rinse jets formed along its length, and positioned approximately perpendicular to the direction of travel of plate members 11 and spanning substantially the entire width of apparatus 10. Also shown in FIG. 5 between rinse means 51 and 54 is rinse scrubber means 42 including rotary scrub brush 42 securely mounted onto central shaft 73. Rotary scrub brush 42 is aligned in the same manner as rotary scrub brush 41. Positioned below rinse means 51 and 54 and support means 40 is second rinse fluid sink 48 having rinse fluid drainage means including drain 50 and outlet conduit 49 for the removal of collected excess rinse fluid 76 from the interior of second sink 48. Alternative embodiments of the present invention could also include the omission of the aforementioned second sink 48 and the use of other sorts of liquid rinse drainage conduits such as an ordinary drain built into the floor underneath apparatus 10. Fourth drive means assembly 9 is a pair of squeegee rollers for the removal of excess liquid rinses from plates 11 passing therethrough prior to the passage of plate members 11 from the exit side of scrubbing station means 46. Frame 16 further operably supports sinks 77 and 48 as well as scrubbing means 41 and 42.

Also shown in FIG. 5, are motor means 58 of drive means assembly 6 driving roller members 27 and 25, motor means 60 of drive means assembly 7 driving roller members 28 and 29, motor means 61 of drive means assembly 8 driving roller members 30 and 31, and motor means 63 of drive means assembly 9 driving roller members 32 and 34. Motor means 59 and 62 are further shown which serve to drive scrubbing means 41 and 42. Motor means 58, 59, 60, 61, 62 and 63, in the preferred embodiment can contain electric motors as well as cooperating transmissions to drive the aforementioned roller members and scrubbing means. In the preferred embodiment lower roller members 25, 29, 31 and 34 are directly driven by their respective motor means and are operably associated with their corresponding upper roller members 27, 28, 30 and 32 by gear means including lower spur gear members such as 64 shown in FIG. 6, being affixed concentrically to at least one of the ends of each of the lower roller members 25, 29, 31 and 34 and a corresponding upper spur gear member 65, as shown in FIG. 6, being concentrically affixed about the corresponding end of the upper roller members 27, 28, 30 and 32 so that spur gear members 64 and 65 mesh and result in rotation of each lower roller member by its respective drive means thereby in turn rotating its corresponding upper roller member in an opposite respective rotative direction. Further considered within the scope of the present invention to provide other gear and motor arrangements for driving one or both of the upper and lower roller members in opposite respective directions. In the preferred embodiment, scrubbing means 41 and 42 are directly driven by their respective motor means 59 and 62.

Removal fixture means 18 is aligned with and juxtaposed to scrubbing station means 46 so as to receive plate members 11 from drive means assembly 9, while accommodating and preserving the shape of peripheral flanges 12 and 13 thereof. Control means are also provided in the preferred embodiment in conjunction with the drive means 46 for coordinating the feeding, driving, dispensing of cleaning solvent, scrubbing, rinsing and removing of plate members 11 into, through and from the apparatus 10 in a synchronized manner. Such control means can comprise any of the many processing units employed to activate any number of the elements and operations of the invention. Alternatively, each of the elements and operations can be separately, manually activated.

In operation, the apparatus and method of the present invention for automatically removing printing ink and other contaminants from a used flanged lithographic plate prior to the sealing of that plate and its storage for archival purposes, operate as follows. Used and soiled lithographic plate member 11 is placed upon feed fixture means 17 such that flanged edge 13 of plate member 11 abuts the edge of planar table surface 24 while the other peripheral flanged edge of plate member 11 is received by slot 21 formed within feed fixture means 17. Glides 20 facilitate the sliding of plate member 11 along feed fixture means 17 until contact is made with the first set of substantially parallel roller members 27 and 25 forming a nip region therebetween. As plate member 11 is pushed into the nip region between oppositely rotating roller members 27 and 25, the plate member is engaged by the rollers and longitudinally propelled to the right, when viewed as in FIG. 5. With respect to apparatus 10, plate member 11 is thereby drawn into the entry side of scrubbing station means 46.

As roller members 27 and 25 continue to rotate in opposite respective directions, plate member 11 passes on to support means 39 having slots 21 and 23 formed therein to preserve and accommodate the peripheral flanges formed in lithographic plate member 11. Support means 39 further has affixed to its sliding surface 24, glides 20 to facilitate the longitudinal travel of plate members 11 over support means 39. As plate member 11 exits from roller members 27 and 25, liquid cleaning solvent 19 is dispensed by cleaning solvent dispensing means 43 through nozzle 43A, which in the preferred embodiment is a cylindrical sprayer rod positioned perpendicular to the direction of travel of plate member 11 and having a single row of solvent discharge sprayers or jets positioned along its length. In the preferred embodiment, the contemplated solvent 19 is DUMAKLEEN brand solvent or the like. Hence, solvent dispensing means 43 dispenses the cleaning solvent liquid 19 directly onto plate member 11 prior to it reaching the rotary scrubber of scrubbing means 41.

Frame 16 supports scrubbing means 41 in such a manner that a nip-like region of contact under rotary scrubber brush 41 is created for plate member 11 to pass through after the application of liquid solvent 19. Scrubbing action is provided to the liquid solvent 19 dispensed to plate member 11, by rotation of central shaft 68 and in turn circular brush element 41. In the preferred embodiment rotary scrub brush element 41 has a circular cross-section and spans substantially the entire width of apparatus 10 so as to enable scrubbing of even the largest size plate members 11. The spent liquid solvent 19 cascades downward from support means 39 through the openings provided therein to accommodate roller members 27 and 25 as well as roller members 28 and 29. Solvent collection sink 77 catches such spent liquid solvent 19, directs it through drain 47, through tank 78 having filter 79 therein to filter said solvent 19, to recirculating pump 45 and return conduit 44 which directs such liquid solvent 19 back to liquid dispensing means 43 for reapplication thereof to plate members 11 passing thereunder. Ventilator hood 39 and extractor fan 57 serve to prevent the potentially dangerous accumulation of liquid solvent fumes within apparatus 10.

After leaving scrubbing means 41, plate members 11 continue to longitudinally pass through apparatus 10 over support 39 until the right edge, when viewed as in FIG. 5, of plate member 11 encounters the nip region of oppositely rotating roller members 28 and 29 so as to be engaged and continuously driven until similar engagement and lateral propelling of plate member 11 by roller members 30 and 31 through the nip region thereof. In the preferred embodiment, roller members 25, 29, 31 and 34 are sized and further have interruptions such as 26 and 33 shown in FIG. 3, for the purpose of accommodating and preserving the preformed flanges of plate members 11. As such plate members exit from roller members 30 and 31, rinse liquid conduit 57 carries rinse liquid 76 to nozzle 52 of rinsing means 51, in the preferred embodiment consisting of a cylindrically shaped rod sprayer positioned substantially perpendicular with respect to the direction of travel of plate members 11 and having a twin set of rinse liquid discharge jets formed along its length. Additional rinse liquid is provided by second rinse means 54 including rinse liquid conduit 56 and nozzle 55.

In the preferred embodiment nozzle 55 also takes the form of a substantially cylindrical rod-like sprayer positioned substantially perpendicular to the direction of travel of plate members 11 thereunder and has a single row of liquid rinse discharge jets formed therein which, just as with rinse means 51, substantially span the width of apparatus 10 so as to enable application of rinse liquids to virtually the entire surface of even the largest plate members 11 passing thereunder. Solvent dispensing nozzle 43A likewise has dispensing jets formed therein so as to span even the width of the widest lithographic plate members 11 passing thereunder, in the preferred embodiment. As plate members 11 continue to pass over support means 40 and under rinse means 51 and 54, longitudinal travel is facilitated once again by glides 20 positioned on planar surfaces 24. As plate members 11 continue to longitudinally travel, they encounter second scrubbing means 42 positioned upon frame 16 so as to once again create a nip region of contact with rotary scrubber 42 so as to provide increased scrubbing action and increased rinsing and cleaning of the lithographic plate members 11. After being scrubbed by second scrubbing means 42, plate members 11 encounter the nip region of oppositely rotating roller members 32 and 34 which also act to "squeegee" residue rinse liquid into the rinse liquid collection sink 48 while prompting the lithographic plate member 11 onto removal fixture means 18. Sink 48 positioned beneath rinse means 51 and 54 catches excess rinse liquid, (in the preferred embodiment being water,) which cascades downward through the openings provided for roller members 30 and 31 as well as 32 and 34, and does not recirculate the water but merely purges the water so as to ensure that plate members 11 are being continuously rinsed by clean rinse liquids. Nylon slides 20 are provided on planar table surface 24 of removal fixture means 18 to preclude any surface adhesion between the stainless steel removal fixture means 18 planar table surface 24 and plate members 11.

Hence, the control means, feed fixture means 17, drive means including assemblies 6, 7, 8 and 9, scrubbing station means 46, support means 39 and 40 and removal fixture means 18 cooperate so as to provide substantially automatic and continuous feeding, dispensing of cleaning solvent, scrubbing, rinsing and removing of the lithographic plate members 11 into, through and from the apparatus 10, while accommodating and preserving the peripheral flanges 12 and 13 formed therein.

A method for cleaning, storing and unsealing one or more lithographic plate members 11 having pre-formed peripheral flanges 12 and 13 and ink residue and other contaminants on its surface can comprise first, removing one or more used plates 11 from a press drum. Next, plate members 11 are placed on feed fixture means 17. Drive means assemblies 6, 7, 8 and 9 then longitudinally propel plate members 11 through apparatus 10. One or more cleaning solvents 19 are then applied to the surface 14 of plate members 11. Surfaces 14 of plate members 11 are then scrubbed prior to rinsing surfaces 14 of the plate members 11 with one or more rinse liquids 76. Plate members 11 are then scrubbed once again prior to the removal of excess rinse liquids 76 from surfaces 14 of plate members 11. Surfaces 14 of plate members 11 are then sealed with a water soluable preserving substance so as to inhibit moisture damage due to oxidation of plate members 11. The use of such a water soluable sealant enable its facilitated removal, by a subsequent press run from a press's own water train prior to storing or archiving of such plate members until future use thereof.

The foregoing descriptions and drawings merely explain and illustrate the invention, the invention is not limited thereto, except insofar as the appended claims are so limited, as those skilled in the art who have the disclosures before them will be able to make modification and variations therein without departing from the spirit and scope of the invention.

What is claimed is:

1. A method for cleaning, storing and unsealing at least one lithographic plate member having pre-formed peripheral flanges and ink residue and other contaminants on its surface, comprising the steps of:

removing at least one plate member from the press plate drum;
placing said plate member on feed fixture means;
longitudinally propelling said plate member by drive means;
applying at least one cleaning solvent to said surface of said plate member;
scrubbing said surface of said plate member;
rinsing said surface of said plate member with at least one rinse liquid;
scrubbing further said surface of said plate member;
removing of excess rinse liquid from said surface of said plate member;
sealing said surface of said plate member with a water soluble preserving substance so as to reduce the moisture sensitivity of said plate member after applying at least one cleaning solvent to said surface of said plate member, scrubbing said surface, rinsing said surface, scrubbing further said surface and removing of excess rinse liquid from said surface, said water soluble substance enabling removal of said substance during a subsequent press run from the press's own water train;
receiving said plate member from removal fixture means; and
storing said plate member until reuse thereof.

2. The method according to claim 1 and further comprising further the step of:

supportably transporting said plate member from said feed fixture means to said removal fixture means upon support means,
said support means being operably interposed between said drive means to facilitate said longitudinal propelling of said plate member.
said support means including substantially flat planar support surfaces operably aligned with said drive means and having planar sliding surfaces thereon, and said support means further including flange accommodation means for preserving and accommodating the shape of said peripheral flanges formed in said plate member.

3. The method according to claim 2 wherein said support means are operably supported by frame means.

4. The method according to claim 2 wherein said flange accommodation means comprises a plurality of longitudinally extending slots formed in said flat planar support surfaces for accommodating said peripheral flanges of said plate member.

5. The method according to claim 4 wherein said plurality of longitudinally extending slots accommodates a plurality of plate member sizes through the positioning and location of said plurality of longitudinally extending slots.

6. The method according to claim 5 wherein said plurality of plate member sizes accommodated by said plurality of longitudinally extending slots is four.

7. The method according to claim 1 wherein said step of longitudinally propelling said plate member by drive means further comprises the steps of:
   bringing said plate member to at least one nip region, said nip region being formed by at least two rollers having substantially parallel axes of rotation and being operably positioned in substantially proximate relation to each other.
   said at least two rollers including substantially parallel upper and lower rotating rollers, and said upper and lower rotating rollers each having an axis of rotation positioned substantially perpendicular to said longitudinal direction;
   said rollers rotating in opposite directions so as to immediately grasp said plate member and propel same in said longitudinal direction, and
   said rollers further including flange accommodation means including interruptions positioned along each of said roller's axis of rotation for accommodating and preserving the shape of said peripheral flanges of said plate members.

8. The method according to claim 7 wherein said rollers are fabricated of a substantially elastomeric material.

9. The method according to claim 7 wherein at least each said lower roller is rotatably driven by motor means.

10. The method according to claim 7 wherein both said upper and lower rollers are rotatably driven by motor means.

11. The method according to claim 1 wherein said step of applying at least one cleaning solvent to said surface of said plate member further comprises the step of:
   spraying at least one cleaning solvent upon said plate member with at least one solvent sprayer member operably positioned to spray said at least one solvent upon said surface of said plate member.

12. The method according to claim 11 wherein said step of scrubbing said surface of said plate member further comprises the step of:
   exposing said plate member to at least one electrically powered rotary brush having an axis of rotation positioned substantially perpendicular to said longitudinal direction.

13. The method according to claim 11 wherein said step of rinsing said surface of said plate member with at least one rinse liquid further comprises the step of:
   spraying said plate member with at least one rinse liquid upon said surface of said plate member from at least one rinse sprayer, operably positioned above said longitudinally propelled plate member, and having a plurality of discharge streams sprayed therefrom.

14. The method according to claim 13 wherein said step of scrubbing further said surface of said plate member further comprises the step of:
   exposing said surface of said plate member to at least one rinse scrubber including at least one electrically powered rotary brush, having an axis of rotation positioned substantially perpendicular to said longitudinal direction.

15. The method according to claim 11 wherein said step of removing said excess rinse liquid from said plate member further comprises the step of:
   propelling said plate member through at least one pair of upper and lower squeegee rollers,
   said squeegee rollers having axes of rotation positioned substantially perpendicular to said longitudinal direction, and
   said squeegee rollers being disposed in juxtaposed roller contact.

16. The method according to claim 11 further comprising the steps of:
   collecting said at least one cleaning solvent, in at least one collection sink operably positioned beneath said propelled plate member, after said solvent is applied to said surface of said plate member;
   filtering said solvent in at least one tank means to remove impurities and particulate matter therefrom; and
   recirculating said at least one solvent with a recirculating pump, for reapplication of said at least one solvent to surface of subsequently propelled plate members.

17. The method according to claim 16 further comprising the step of:
   collecting, with exhaust means positioned above said collection sink, fumes released by said solvent during said application of said solvent to said surface of said plate member.

18. The method according to claim 11 further comprising the steps of:
   collecting said excess rinse liquid from said surface of said plate member; and
   draining said collected excess rinse liquid removed from said surface of said plate member to a remote location for safe disposal thereafter.

19. The method according to claim 11 wherein said step of propelling said plate member by said drive means, said drive means further including:
   four pairs of drive roller members,
   a first pair of drive roller members being juxtaposed to said feed fixture means,
   a second pair of drive roller members being positioned proximate to where said cleaning solvent is applied to said plate member,
   a third pair of drive roller members being positioned proximate to where said plate member is rinsed, and
   a fourth pair of drive roller members being positioned proximate to said removal fixture means.

20. A method for cleaning, storing and unsealing at least one lithographic plate member having pre-formed peripheral flanges and ink residue and other contaminants on its surface, comprising the steps of:

removing at least one plate member from the press plate drum;
placing said plate member on feed fixture means;
longitudinally propelling said plate member by drive means;
applying at least one cleaning solvent to said surface of said plate member;
scrubbing said surface of said plate member;
rinsing said surface of said plate member with at least one rinse liquid;
scrubbing further said surface of said plate member;
removing of excess rinse liquid from said surface of said plate member;
sealing said surface of said plate member with a water soluble preserving substance so as to reduce the moisture sensitivity of said plate member,
said water soluble substance enabling removal of said substance during a subsequent press run from the press's own water train;
receiving said plate member from removal fixture means;
storing said plate member until reuse thereof;
supportably transporting said plate member from said feed fixture means to said removal fixture means upon support means,
said support means being operably interposed between said drive means to facilitate said longitudinal propelling of said plate member,
said support means including substantially flat planar support surfaces operably aligned with said drive means and having planar sliding surfaces thereon, and
said support means further including flange accommodation means for preserving and accommodating the shape of said peripheral flanges formed in said plate member.

21. A method for cleaning, storing and unsealing at least one lithographic plate member having pre-formed peripheral flanges and ink residue and other contaminants on its surface, comprising the steps of:

removing at least one plate member from the press plate drum;
placing said plate member on feed fixture means;
longitudinally propelling said plate member by drive means by bringing said plate member to at least one nip region, said nip region being formed by at least two rollers having substantially parallel axes of rotation and being operably positioned in substantially proximate relation relative to each other,
said at least two rollers including substantially parallel upper and lower rotating rollers, and said upper and lower rotating rollers each having an axis of rotation positioned substantially perpendicular to said longitudinal direction;
said rollers rotating in opposite directions so as to immediately grasp said plate member and propel same in said longitudinal direction,
said rollers further including flange accommodation means including interruptions positioned along each of said roller's axis of rotation for accommodating and preserving the shape of said peripheral flanges of said plate member;
applying at least one cleaning solvent to surface of said plate member;
scrubbing said surface of said plate member;
rinsing said surface of said plate member with at least one rinse liquid;
scrubbing further said surface of said plate member;
rinsing said surface of said plate member with at least one rinse liquid;
scrubbing further said surface of said plate member;
removing of excess rinse liquid from said surface of said plate member;
sealing said surface of said plate member with a water soluble preserving substance so as to reduce the moisture sensitivity of said plate member,
said water soluble substance enabling removal of said substance during a subsequent press run from the press's own water train;
receiving said plate member from removal fixture means; and
storing said plate member until reuse thereof.

22. A method for cleaning, storing and unsealing at least one lithographic plate member having pre-formed peripheral flanges and ink residue and other contaminants on its surface, comprising the steps of:

removing at least one plate member from the press plate drum;
placing said plate member on feed fixture means;
longitudinally propelling said plate member by drive means;
spraying at least one cleaning solvent upon said plate member with at least one solvent sprayer member operably positioned to spray said at least one solvent upon said surface of said plate member;
scrubbing said surface of said plate member;
rinsing said surface of said plate member with at least one rinse liquid;
scrubbing further said surface of said plate member;
removing of excess rinse liquid from said surface of said plate member;
sealing said surface of said plate member with a water soluble preserving substance so as to reduce the moisture sensitivity of said plate member,
said water soluble substance enabling removal of said substance during a subsequent press run from the press's own water train;
receiving said plate member from removal fixture means; and
storing said plate member until reuse thereof.

23. A method for cleaning, storing and unsealing at least one lithographic plate member having pre-formed peripheral flanges and ink residue and other contaminants on its surface, comprising the steps of:

removing at least one plate member from the press plate drum;
placing said plate member on feed fixture means;
longitudinally propelling said plate member by drive means;
applying at least one cleaning solvent to said surface of said plate member;
scrubbing said surface of said plate member;
rinsing said surface of said plate member with at least one rinse liquid;
scrubbing further said surface of said plate member;
removing of excess rinse liquid from said surface of said plate member by propelling said plate member through at least one pair of upper and lower squeegee rollers,
said squeegee rollers having axes of rotation positioned substantially perpendicular to said longitudinal direction, said squeegee rollers being disposed in juxtaposed rolling contact;

sealing said surface of said plate member with a water soluble preserving substance so as to reduce the moisture sensitivity of said plate member, said water soluble substance enabling removal of said substance during a subsequent press run from the press's own water train;

receiving said plate member from removal fixture means; and storing said plate member until reuse thereof.

24. A method for cleaning, storing and unsealing at least one lithographic plate member having pre-formed peripheral flanges and ink residue and other contaminants on its surface, comprising the steps of:

removing at least one plate member from the press plate drum;

placing said plate member on feed fixture means;

longitudinally propelling said plate member by drive means;

applying at least one cleaning solvent to said surface of said plate member;

collecting said at least one cleaning solvent, in at least one collection sink operably positioned beneath said propelled plate member, after said solvent is applied to said surface of said plate member;

filtering said solvent in at least one tank means to remove impurities and particulate matter therefrom;

recirculating said at least one solvent with a recirculating pump, for reapplication of said at least one solvent to the surface of at least one other subsequently propelled plate member;

scrubbing said surface of said plate member;

rinsing said surface of said plate member with at least one rinse liquid;

scrubbing further said surface of said plate member;

removing of excess rinse liquid from said surface of said plate member;

sealing said surface of said plate member with a water soluble preserving substance so as to reduce the moisture sensitivity of said plate member, said water soluble substance enabling removal of said substance during a subsequent press run from the press's own water train;

receiving said plate member from removal fixture means; and storing said plate member until reuse thereof.

25. A method for cleaning, storing and unsealing at least one lithographic plate member having pre-formed peripheral flanges and ink residue and other contaminants on its surface, comprising the steps of:

removing at least one plate member from the press plate drum;

placing said plate member on feed fixture means;

longitudinally propelling said plate member by drive means;

applying at least one cleaning solvent to said surface of said plate member;

scrubbing said surface of said plate member;

rinsing said surface of said plate member with at least one rinse liquid;

scrubbing further said surface of said plate member;

removing of excess rinse liquid from said surface of said plate member;

collecting said excess rinse liquid from said surface of said plate member;

draining said collected excess rinse liquid removed from said surface of said plate member to a remote location for safe disposal thereafter;

sealing said surface of said plate member with a water soluble preserving substance so as to reduce the moisture sensitivity of said plate member, said water soluble substance enabling removal of said substance during a subsequent press run from the press's own water train;

receiving said plate member from removal fixture means; and storing said plate member until reuse thereof.

26. A method for cleaning, storing and unsealing at least one lithographic plate member having pre-formed peripheral flanges and ink residue and other contaminants on its surface, comprising the steps of:

removing at least one plate member from the press plate drum;

placing said plate member on feed fixture means;

applying at least one cleaning solvent to said surface of said plate member;

scrubbing said surface of said plate member;

rinsing said surface of said plate member with at least one rinse liquid;

scrubbing further said surface of said plate member;

removing of excess rinse liquid from said surface of said plate member;

sealing said surface of said plate member with a water soluble preserving substance so as to reduce the moisture sensitivity of said plate member, said water soluble substance enabling removal of said substance during a subsequent press run from the press's own water train;

receiving said plate member from removal fixture means;

longitudinally propelled said plate member by drive means including four pairs of drive roller members, a first pair of drive roller members being juxtaposed to said feed fixture means, a second pair of drive roller members being positioned proximate to where said cleaning solvent is applied to said plate member, a third pair of drive roller members being positioned proximate to where said plate member is rinsed, a fourth pair of drive roller members being positioned proximate to said removal fixture means; and storing said plate member until reuse thereof.

* * * * *

UNITED STATES PATENT AND TRADEMARK OFFICE
CERTIFICATE OF CORRECTION

PATENT NO. : 4,894,095
DATED : January 16, 1990
INVENTOR(S) : Schramm, et al.

It is certified that error appears in the above-identified patent and that said Letters Patent is hereby corrected as shown below:

| | |
|---|---|
| Title Page, First Column, [73] Assignee: | Delete "Law Offices of Dick and Harris, Chicago, Ill." and instead insert --W.A. Krueger Co., Scottsdale, Arizona-- |
| Col. 2, Line 37 | Delete ".at-least" and instead inert --at least-- |
| Col. 3, Line 59 | Delete "surfaces The" and instead insert --surfaces. The-- |
| Col. 3, Line 62 | Delete "sliding surfaces" and instead insert --sliding surfaces.-- |
| Col. 12, Line 66 | Delete "said plate member." and instead insert --said plate member,-- |
| Col. 13, Line 30 | Delete "each other." and instead insert --each other,-- |

Signed and Sealed this

Twenty-ninth Day of September, 1992

Attest:

DOUGLAS B. COMER

Attesting Officer     Acting Commissioner of Patents and Trademarks